(12) United States Patent
Chen

(10) Patent No.: US 7,538,278 B2
(45) Date of Patent: May 26, 2009

(54) PRINTED CIRCUIT BOARD FOR PREVENTING INCREASE OF THERMAL EXPANSION

(75) Inventor: Hui-Chang Chen, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 230 days.

(21) Appl. No.: 10/858,906

(22) Filed: Jun. 2, 2004

(65) Prior Publication Data

US 2005/0139382 A1  Jun. 30, 2005

(30) Foreign Application Priority Data

Dec. 25, 2003  (TW) .............................. 92136814 A

(51) Int. Cl.
H05K 1/00 (2006.01)

(52) U.S. Cl. .................. 174/254; 174/255; 361/749

(58) Field of Classification Search ......... 174/254–258; 361/749–750, 784–785, 803; 349/149–151, 349/129, 146, 190–191

See application file for complete search history.

(56) References Cited

U.S. PATENT DOCUMENTS

| 5,600,884 | A | * | 2/1997 | Kondo et al. ................... 29/852 |
| 5,759,047 | A | * | 6/1998 | Brodsky et al. ................ 439/66 |
| 5,907,380 | A | * | 5/1999 | Lien ............................ 349/141 |
| 6,042,894 | A | * | 3/2000 | Goto et al. ................... 427/504 |
| 6,256,080 | B1 | * | 7/2001 | Colgan et al. ................ 349/129 |
| 6,291,776 | B1 | * | 9/2001 | Markovich et al. .......... 174/262 |
| 6,573,965 | B1 | * | 6/2003 | Liu et al. ..................... 349/129 |
| 6,595,784 | B2 | * | 7/2003 | Brodsky et al. ................ 439/66 |
| 2001/0029118 | A1 | * | 10/2001 | Ota .............................. 439/65 |

FOREIGN PATENT DOCUMENTS

CN 1475834 A 2/2004

OTHER PUBLICATIONS

China Office Action.

* cited by examiner

*Primary Examiner*—Tuan T Dinh
(74) *Attorney, Agent, or Firm*—Thomas, Kayden, Horstemeyer & Risley

(57) ABSTRACT

A printed circuit board (PCB) for a display preventing increase of thermal expansion. The PCB comprises a plurality of bonding regions and at least one opening. The bonding regions are disposed on the inner side of the PCB. The opening is disposed between two adjacent bonding regions.

7 Claims, 7 Drawing Sheets

PRINTED CIRCUIT BOARD FOR PREVENTING INCREASE OF THERMAL EXPANSION

BACKGROUND OF THE INVENTION

1. Field of the Invention

The present invention relates to the package of a printed circuit board and in particular to a method and a structure for preventing increased thermal expansion between a display panel and a printed circuit board.

2. Description of the Related Art

Printed circuit boards can electrically connect panels via flexible printed circuit boards (FPCs). For example, a liquid crystal display module (LCM) comprises a glass substrate and a PCB (Printed Circuit Borad) connected thereto via a FPC. In a LCD fabrication process, electrodes on the PCB of the LCM are electrically connected to the electrodes of the FPC by thermal bonding.

FIG. 1A is a schematic diagram of a LCM. Referring to FIG. 1A, the LCM 100 comprises a PCB 10, a plurality of FPCs 12 and a glass substrate 13 connected to the FPC 12. A plurality of electrodes 14 are disposed on the inner side of the PCB 10 and in the thermal bonding region 11. Each FPC 12 comprises a plurality electrodes corresponding to the electrodes 14 in the thermal bonding region 11 of the PCB 10. The FPCs 12 are connected to the glass substrate 13 of the LCD on the opposite side thereof(not shown). As shown in FIG. 1B, when the FPC 12 and the PCB 10 are bonded, the electrodes on both are electrically connected. Therefore, signals can be transmitted from the PCB 10 to the LCD 13 through the FPC 12 to display images.

Typically, the FPCs 12 are bonded to the PCB 10 by thermal bonding, wherein a long press pad or a short press pad is employed. Alignment of the PCB 10 and the FPC 12 is affected, however, by thermal expansion and cold shrinkage during bonding. FIG. 2A is a top view of a LCM. Typically, thermal expansion of the PCB material 10 is greater than material of the FPC 12. Consequently, the FPC 12 is deformed according to the thermal expansion of the PCB 10. Additionally, the thermal expansion effect increases from the center to the edge of the PCB 10. The FPC 12 adjacent to the center line of the PCB 10 is pressed and the effect is increased to the edge. Thus, the square shape of the FPC 12 is deformed to a ladder-shape.

Additionally, as shown in FIG. 2B, the LCM 100 shrinks when cooling subsequent to thermal bonding. Thus, the FPCs 12 are again deformed by shrinkage of the PCB 10. Specifically, the deformation of the FPCs 12 near the edge of the PCB 10 is increased, thus, causing the FPCs 11 to break.

Consequently, compensation for thermal expansion must be considered. The deformation of the FPCs 12 varies, however, according their position, hence determining a compensation factor is difficult.

SUMMARY OF THE INVENTION

Accordingly, an object of the invention is to provide a printed circuit board structure on a display panel for preventing thermal expansion and shrinkage increasing from the center to the edge of the PCB, thus simplifying calculation of compensation factors.

Another object of the invention is to provide a printed circuit board structure on a display panel for preventing flexible printed circuit board breakage due to thermal expansion or shrinkage.

The main feature of the invention is to form at least one opening between two adjacent thermal bonding regions on a PCB. The opening is in the PCB, thus thermal expansion or shrinkage resulting from thermal bonding does not increase from the center to the edge of the PCB. Consequently, the amount of thermal expansion or shrinkage on each region of the PCB is the same, enabling easy determination of compensating thermal effect. Furthermore, FPC of in the edge thermal bonding region is prevented, thus improving yield.

To achieve the above objects, the present invention provides a printed circuit board structure on a display panel for preventing thermal expansion and shrinkage increasing from the center to the edge of the PCB, comprising a plurality of bonding regions disposed on the inner side thereof, and an opening disposed between two adjacent bonding regions.

The PCB comprises a plurality of PCB electrodes. The opening can be a rectangle, a circle, a semicircle, polygon, or any regular or irregular shape.

Additionally, the present invention provides another printed circuit board structure on a display panel for preventing an increase in the number of deformations from the center to the edge of the PCB due to thermal bonding, comprising a plurality of thermal bonding regions disposed on the inner side thereof for connecting corresponding FPCs, and an opening disposed between two adjacent thermal bonding regions.

The present invention further provides another printed circuit board structure on a display panel for preventing increase of thermal expansion and shrinkage. A plurality of thermal bonding regions are disposed on the inner side of a PCB for connection to the corresponding FPCs, and a plurality of openings are disposed between two adjacent thermal bonding regions in the PCB.

Furthermore, the present invention provides another printed circuit board on a display panel for preventing an increased number of deformations from the center to the edge of the PCB. One side of the FPCs is connected to a display panel and the opposite site is connected to the PCB, wherein the PCB comprises a plurality of thermal bonding regions disposed on the inner side thereof connected to the corresponding FPCs. A plurality of openings are disposed between two adjacent thermal bonding regions in the PCB.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
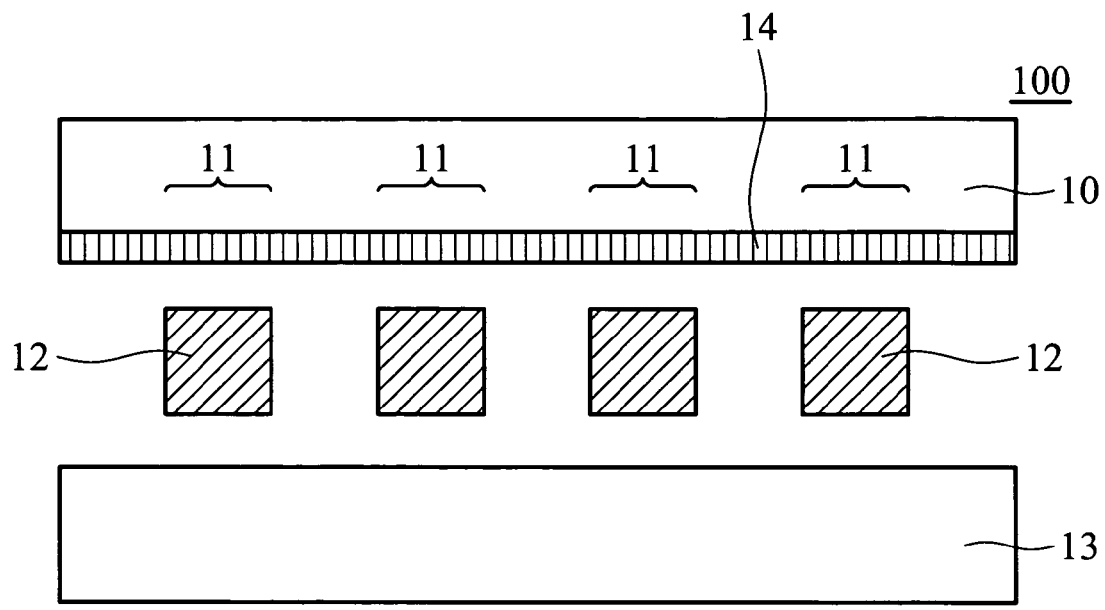
FIG. 1A is a top view of conventional display panel before thermal bonding.
Figure 1B:
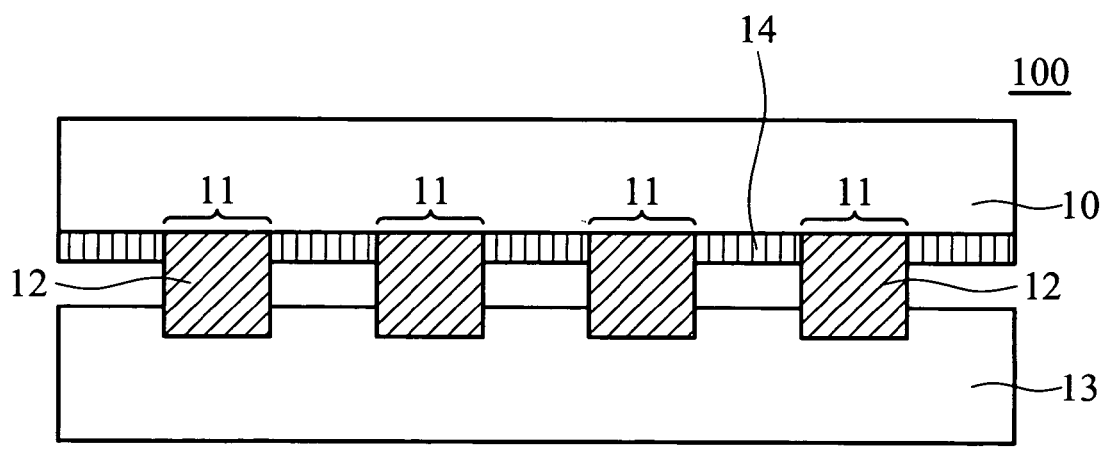
FIG. 1B is a top view of conventional display panel after thermal bonding.
Figure 2A:
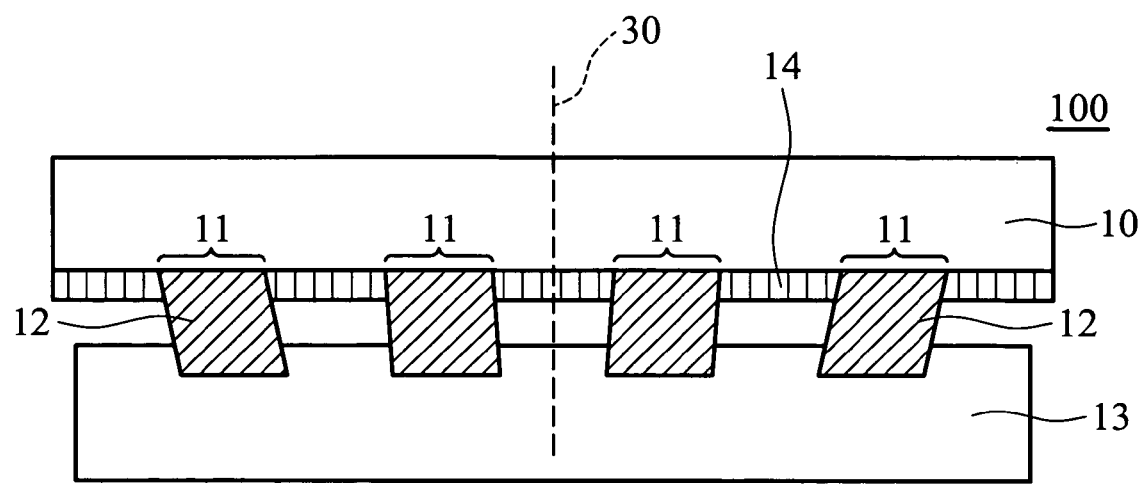
FIG. 2A illustrates thermal expansion after thermal bonding in a conventional display panel.
Figure 2B:
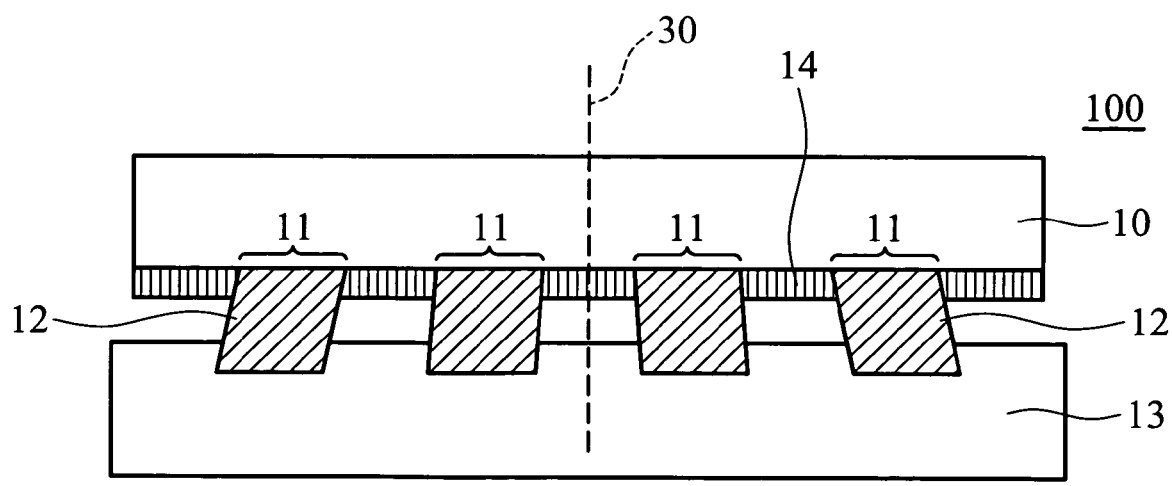
FIG. 2B illustrates shrinkage after thermal bonding in a conventional display panel.
Figure 3A:
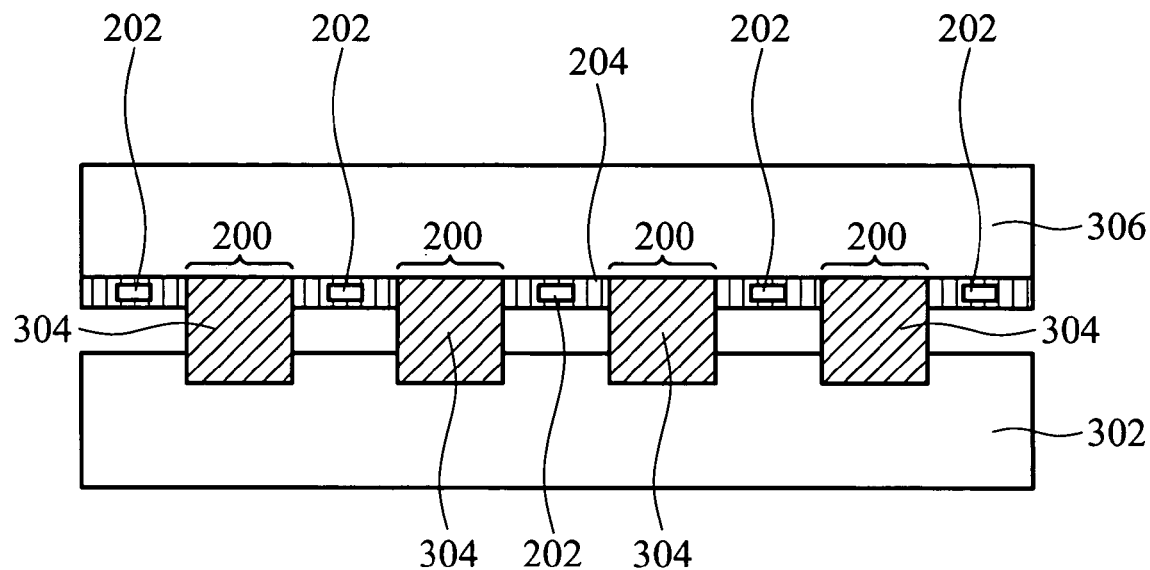
FIG. 3A is a top view of the display panel of the preferred embodiment.
Figure 3B:
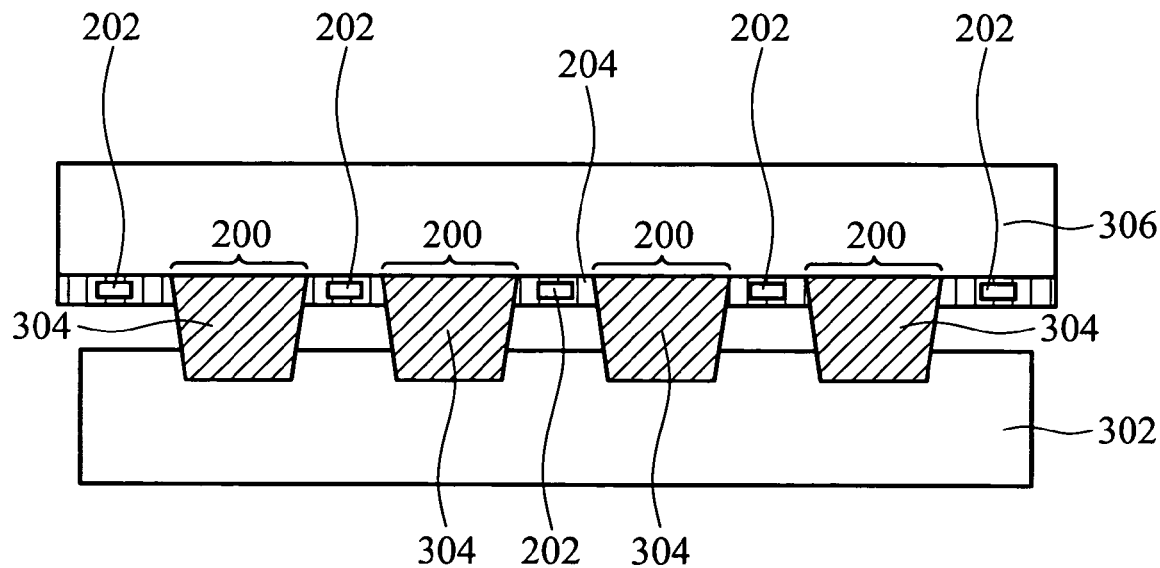
FIG. 3B is a top view of the display panel after thermal expansion of the invention.
Figure 3C:
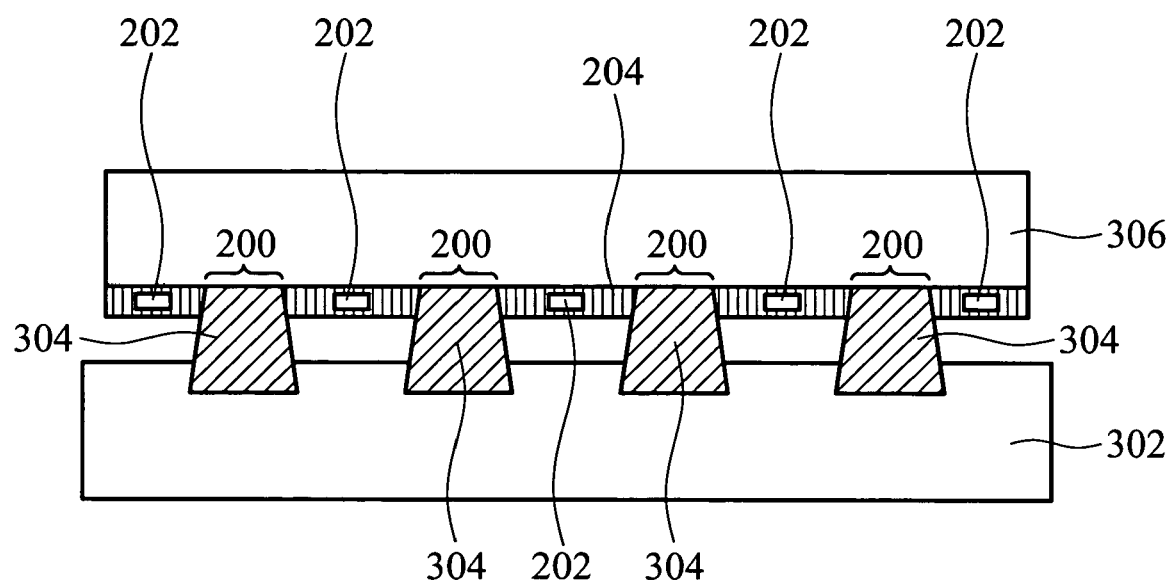
FIG. 3C is a top view of the display panel after shrinkage of the invention.

FIG. 3A is a top view of the display panel of the preferred embodiment. FIG. 3B is a top view of the invention of the display panel after thermal expansion. FIG. 3C is a top view of the display panel of the invention after shrinkage.

As shown in FIG. 3A, a display panel 302, such as a liquid crystal display panel (LCD), a plasma display panel (PDP) or any other panel, is connected to a printed circuit board 306 (PCB) by a plurality of bonding device, such as flexible circuit printed boards 304 (FPC). One side of each FPC 304 is connected to the display panel 302. A plurality of patterned electrodes are disposed on the inner side of the PCB electrodes 204. The specific regions on the inner side of the PCB 306 serve as thermal bonding regions 200 according to design. The opposite side of each FPC 304 is bonded to the inner side of the PCB 306 in the thermal bonding region 200. Thus, the PCB 306 is electrically connected to the display panel 302 by the FPCs 304. A plurality of electrodes are disposed on the inner side of the FPCs 302, herein the electrodes are referred to as FPC electrodes. The FPC electrodes are electrically connected to the PCB electrodes 204 after thermal bonding. The FPCs 304 are bonded to the PCB 306 by an anisotropic conductive film (ACF) therebetween in the thermal bonding region 200, in high temperature and high pressure conditions. The PCB 306 and the FPCs 304 are bonded by a press pad, wherein the press pad can be a long or short press pad. The long press pad can bond a plurality of FPCs 302 onto a PCB 304 simultaneously. The short press pad can bond one FPC 302 onto a PCB 304 respectively.

Referring to FIG. 3B and FIG. 3C, an opening 202 is disposed between two adjacent thermal bonding regions 200 on the inner side of the PCB 306, wherein the opening 202 is in the PCB 306. Consequently, due to the opening, excessive deformation of the thermal bonding region 200 of the PCB 306, worsening from the center to the edge, is prevented. Thus, regardless of thermal expansion (FIG. 3B) or cold shrinkage (FIG. 3C), FPC 302 deformation is uniform from the center to the edge, thus preventing the enlarged FPCs 302 deformation from the center to the edge of the PCB 306. Additionally, regardless of whether a long or short press pad is used, thermal compensation for all the thermal bonding regions 200 is uniform, thus preventing increased thermal expansion. Furthermore, breakage of the PCB 306 in the thermal bonding region 200 at the edge of the PCB 206 is prevented, thus improving yield.

Figure 4A:
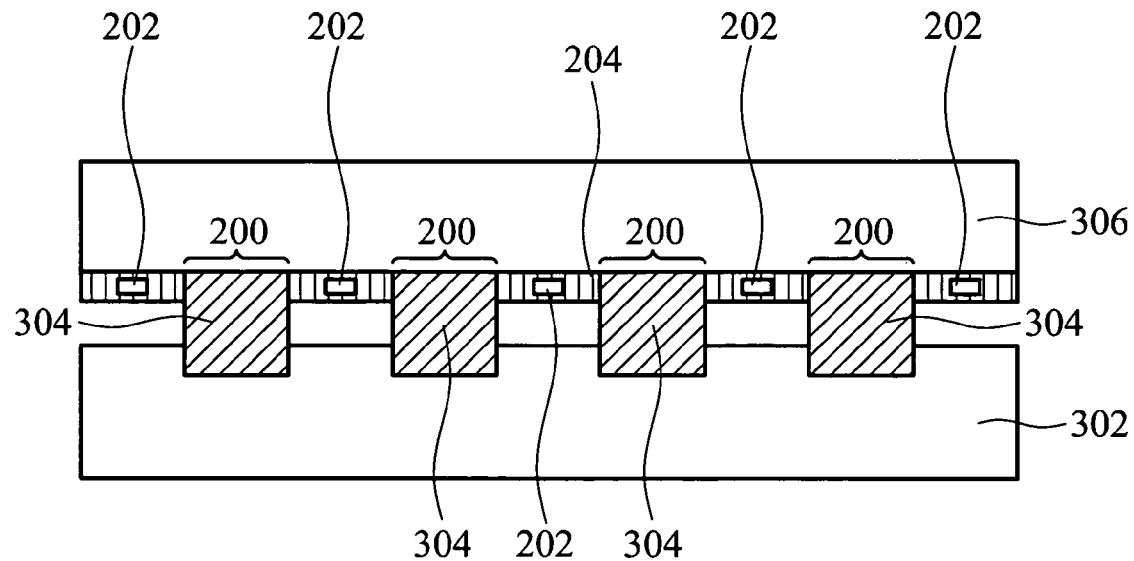
FIG. 4A is a top view the display panel, wherein the openings are in the PCB electrodes.
Figure 4B:
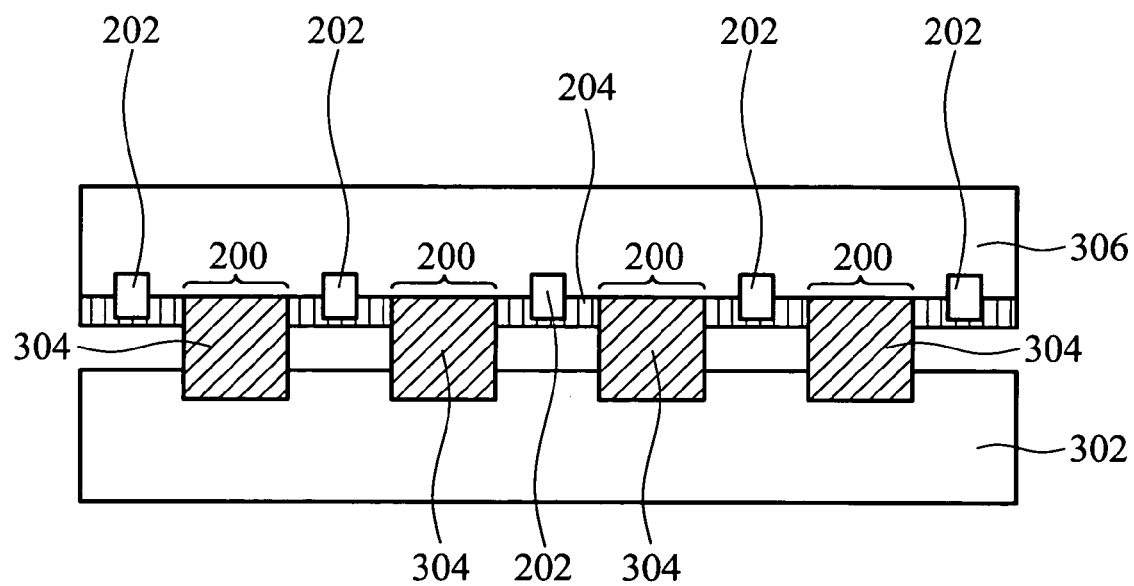
FIG. 4B is a top view the display panel of the further another preferred embodiment, wherein the openings exceed the range of the PCB electrodes.
Figure 4C:
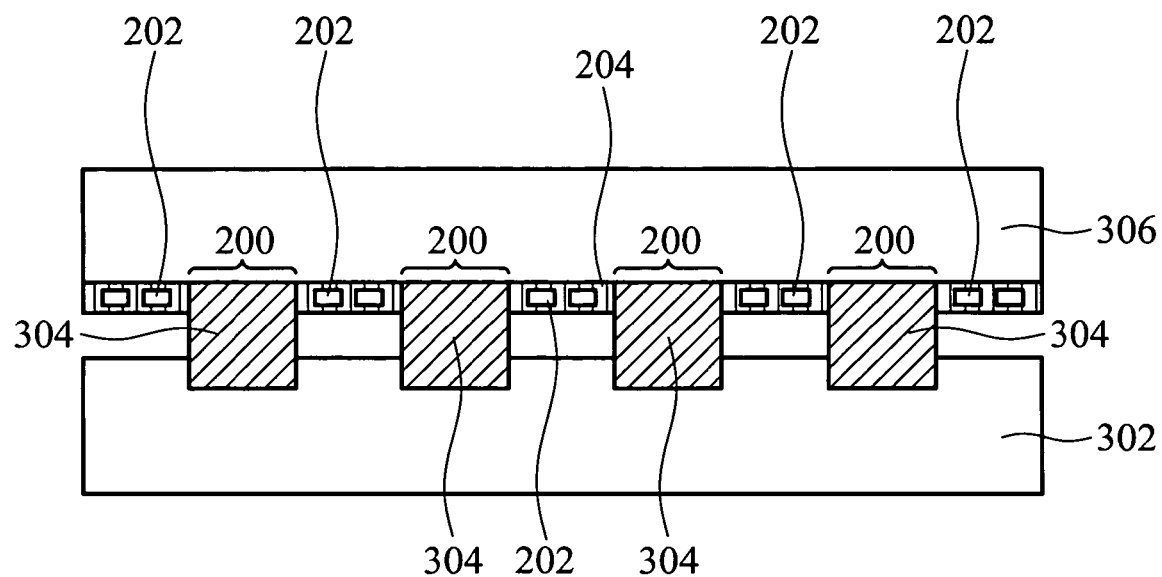
FIG. 4C is a top view of the display panel, wherein more than one opening is disposed between two adjacent bonding regions.
Figure 4D:
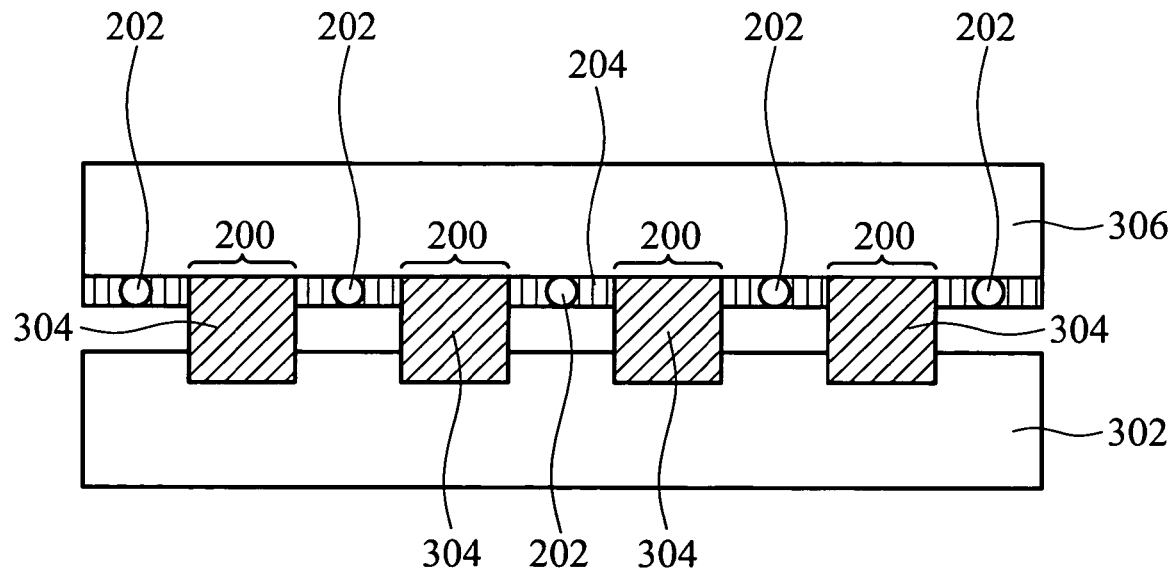
FIG. 4D is a top view the display panel of, wherein the openings are circular.
Figure 4E:
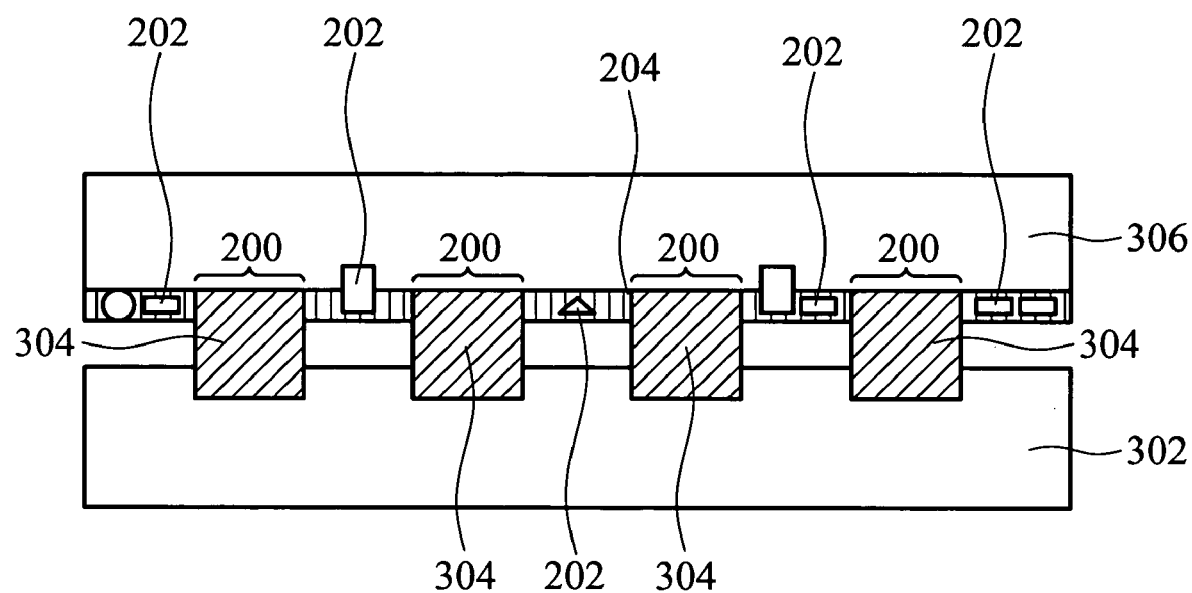
FIG. 4E is a top view the display panel, wherein the PCB comprises a plurality of openings with different shapes and sizes.

Referring to FIG. 4A to FIG. 4E, the opening 202 can be a rectangle, a circle, a semicircle, polygon, or any regular or irregular shape. As shown in FIGS. 4A and 4B, the opening 202 of the invention can equal or exceed the range of the PCB electrodes 204. As well, referring to FIG. 4B, the length of the opening 202 can be greater or less than the thickness of the PCB electrodes 204. However, the opening 202 must be closed.

The number of openings 202 between two adjacent thermal bonding regions 200 can vary depending on requirement. Herein for convenience, only one opening 202 is shown. The size, number and shape of the openings can vary depending on requirements. As well, referring to FIG. 4E, the PCB 306 can comprise different sizes, shapes and number of openings.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display comprising:
   a display panel;
   a printed circuit board, comprising a plurality of bonding regions and at least one patterned electrode, wherein the bonding regions are disposed on an inner side of the printed circuit board and the patterned electrode is disposed on the inner side of the printed circuit board between two adjacent bonding regions, and at least one opening at least partially disposed in the patterned electrode;
   a plurality of bonding device, wherein each bonding device has a first side connected to the display panel and a second side connected to the inner side of the printed circuit board; and
   an isotropic conductive film, disposed between the bonding device and the printed circuit board to connect the second side of the bonding device to the bonding regions on the inner side of the printed circuit board;
   wherein the patterned electrode comprises a printed circuit board electrode, and
   wherein each of the bonding devices comprises a plurality of electrodes connecting to the corresponding printed circuit board electrodes.

2. The display as claimed in claim 1, wherein the opening is rectangular, circular, semicircular or polygonal.

3. The display as claimed in claim 1, wherein the openings have different shapes.

4. The display as claimed in claim 1, wherein the openings have different sizes.

5. The display as claimed in claim 1, wherein the bonding device comprises a flexible printed circuit board.

6. The display as claimed in claim 1, wherein the opening exceeds the corresponding printed circuit board electrode.

7. The display as claimed in claim 5, wherein the printed circuit board electrodes and the flexible printed circuit board electrodes are connected by thermal bonding.

* * * * *